US008258609B2

(12) United States Patent
Camacho et al.

(10) Patent No.: US 8,258,609 B2
(45) Date of Patent: Sep. 4, 2012

(54) INTEGRATED CIRCUIT PACKAGE SYSTEM WITH LEAD SUPPORT

(75) Inventors: Zigmund Ramirez Camacho, Singapore (SG); Henry Descalzo Bathan, Singapore (SG); Jose Alvin Caparas, Singapore (SG); Arnel Trasporto, Singapore (SG)

(73) Assignee: Stats Chippac Ltd., Singapore (SG)

( * ) Notice: Subject to any disclaimer, the term of this patent is extended or adjusted under 35 U.S.C. 154(b) by 899 days.

(21) Appl. No.: 11/689,229

(22) Filed: Mar. 21, 2007

(65) Prior Publication Data

US 2008/0230881 A1 Sep. 25, 2008

(51) Int. Cl.
*H01L 23/495* (2006.01)
*H01L 21/60* (2006.01)

(52) U.S. Cl. . 257/670; 257/666; 257/674; 257/E23.049; 438/123; 438/124

(58) Field of Classification Search .......... 257/666–677; 438/106–127
See application file for complete search history.

(56) References Cited

U.S. PATENT DOCUMENTS

| | | | | |
|---|---|---|---|---|
| 4,771,330 A * | 9/1988 | Long | | 257/672 |
| 5,070,039 A | 12/1991 | Johnson et al. | | |
| 5,168,368 A * | 12/1992 | Gow et al. | | 257/666 |
| 5,173,766 A * | 12/1992 | Long et al. | | 257/687 |
| 5,939,775 A | 8/1999 | Bucci et al. | | |
| 6,258,629 B1 * | 7/2001 | Niones et al. | | 438/111 |
| 6,545,332 B2 * | 4/2003 | Huang | | 257/433 |
| 6,580,159 B1 * | 6/2003 | Fusaro et al. | | 257/668 |
| 7,129,116 B2 | 10/2006 | Islam et al. | | |
| 7,173,321 B2 | 2/2007 | Kim | | |
| 7,304,371 B2 * | 12/2007 | Kim et al. | | 257/674 |
| 7,507,603 B1 * | 3/2009 | Berry et al. | | 438/113 |
| 2003/0006055 A1 * | 1/2003 | Chien-Hung et al. | | 174/52.1 |
| 2005/0287710 A1 * | 12/2005 | Huang et al. | | 438/123 |
| 2006/0001130 A1 | 1/2006 | Islam et al. | | |
| 2006/0249830 A1 * | 11/2006 | Shim et al. | | 257/690 |

* cited by examiner

*Primary Examiner* — Kiesha Bryant
*Assistant Examiner* — Eric Ward
(74) *Attorney, Agent, or Firm* — Ishimaru & Associates LLP; Mikio Ishimaru; Stanley M. Chang

(57) ABSTRACT

An integrated circuit package system is provided including forming a paddle having an integrated circuit die thereover, an outer lead, and an inner lead between the paddle and the outer lead. The integrated circuit package system is also provided including placing a lead support over the inner lead without traversing to an inner body bottom side of the inner lead, connecting the integrated circuit die and the inner lead, and encapsulating the inner lead having the lead support thereover and the inner lead exposed.

18 Claims, 6 Drawing Sheets

INTEGRATED CIRCUIT PACKAGE SYSTEM WITH LEAD SUPPORT

TECHNICAL FIELD

The present invention relates generally to integrated circuit package system, and more particularly to an integrated circuit package system having multiple rows of leads.

BACKGROUND ART

Increased miniaturization of components and greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a lead frame whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat no-lead package ("QFN"). QFN packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with increased number of input/output (I/O) in high volume.

One such obstacle is mold flash covering some of the inner lead contacts and preventing a reliable printed circuit board connection. This situation may be caused by debris on the mold bottom chase under the lead fingers or the clamping pressure on one end of a half etched lead causes the other end to lift. Another possibility is that the lead fingers may be bent or lifted prior to the molding step. The result of these issues is that the finished package may be missing some of the contact pads necessary to connect it to the printed circuit board.

Still thinner, smaller, higher I/O, and lighter package designs and mounting/connecting configurations have been adopted in response to continuing requirements for further miniaturization. At the same time, users are demanding semiconductor packages that are more reliable under increasingly severe operating conditions.

Thus, a need still remains for an integrated circuit package system providing low cost manufacturing, improved yield, and higher pin count for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a paddle having an integrated circuit die thereover, an outer lead, and an inner lead between the paddle and the outer lead. The present invention also provides the integrated circuit package system including placing a lead support over the inner lead without traversing to an inner body bottom side of the inner lead, connecting the integrated circuit die and the inner lead, and encapsulating the inner lead having the lead support thereover and the inner lead exposed.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
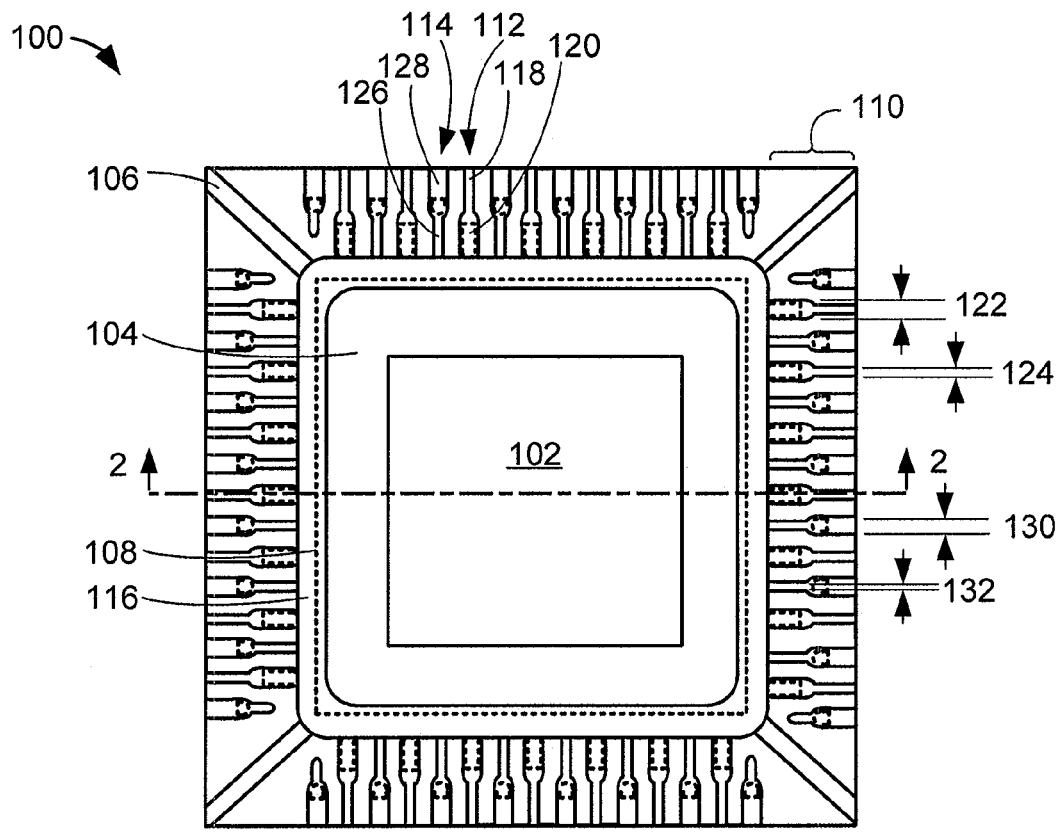
FIG. 1 is a plan view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. Also where multiple embodiments are disclosed, the sequential numbering of the embodiments represents different alternative embodiments of the present invention and does not imply preference order between the embodiments of the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in a first embodiment of the present invention. The plan view depicts a top view of the integrated circuit package system 100 that is uncovered and with an integrated circuit die 102 that is unconnected. The plan view depicts the integrated circuit die 102 over a paddle 104, such as a die-attach paddle. The integrated circuit die 102 has horizontal dimensions less than that of the paddle 104.

The paddle 104 has tie bars 106 extending from corners of the paddle 104. Sides 108 of the paddle 104 are adjacent to dual rows of leads 110. The sides 108 are depicted by dotted lines. The dual rows of the leads 110 include a first row of inner leads 112 and a second row of outer leads 114. For illustrative purposes, the integrated circuit package system 100 is shown with the dual rows of the leads 110, although it is understood that the integrated circuit package system 100 may have the leads 110 that may be different than dual rows, such as a single row or more than dual rows.

A lead support 116, such as a dispensed epoxy adhesive or glob top epoxy, preferably bridges the paddle 104 to protrude between the paddle 104, the inner leads 112 and the outer leads 114 as well as a portion of the tie bars 106 closest to the paddle 104. The lead support 116 is preferably formed in a ring configuration over the sides 108 of the paddle 104 and not contacting the integrated circuit die 102. The lead support 116 provides structural reinforcement to the planar rigidity to hold down the inner leads 112 and the outer leads 114 with the paddle 104 during an encapsulation process.

Each of the inner leads 112 preferably has an inner lead tip 118 and an inner lead body 120. The inner lead tip 118 is towards to the periphery of the integrated circuit package system 100. The inner lead body 120 is towards the center of the integrated circuit package system 100. The plan view depicts the inner lead body 120 having an inner body width 122 extending from an inner tip width 124 of the inner lead tip 118. Typically, the inner lead body 120 provides the contact structure for electrical connection with the integrated circuit die 102. The inner lead tip 118 may also be used for electrical connection with the integrated circuit die 102.

Each of the outer leads 114 preferably has an outer lead tip 126 and an outer lead body 128. The outer lead body 128 is towards to the periphery of the integrated circuit package system 100. The outer lead tip 126 is towards the center of the integrated circuit package system 100. The plan view depicts the outer lead body 128 have an outer body width 130 extending from an outer tip width 132 of the outer lead tip 126. Typically, the outer lead body 128 provides the contact structure for electrical connections with the integrated circuit die 102. The outer lead tip 126 may also be used for electrical connection with the integrated circuit die 102.

As described earlier, the lead support 116 preferably bridges the paddle 104 with the inner leads 112 and the outer leads 114. The lead support 116 preferably bridges the paddle 104 and the inner lead body 120 for reinforcing the inner leads 112 with the lead support 116. The lead support 116 does not cover the inner lead tip 118 or the inner lead body 120 adjacent to the inner lead tip 118. The lead support 116 is shown bridging the paddle 104 and the outer lead tip 126. The lead support 116 does not cover the outer lead body 128 or the outer lead tip 126 adjacent to the outer lead body 128.

For illustrative purposes, the integrated circuit die 102 is shown within the sides 108 of the paddle 104, although it is understood that the integrated circuit die 102 may extend beyond the sides 108 of the paddle 104 and overhanging the paddle 104. Also for illustrative purposes, the integrated circuit die 102 is shown with an area outlined by the ring configuration of the lead support 116, although it is understood that the integrated circuit die 102 may not be within the ring configuration of the lead support 116. For example, the integrated circuit die 102 may extend over the paddle 104 and the lead support 116 and may or may not contact the lead support 116. Further for illustrative purposes, the lead support 116 is shown over the outer leads 114, although it is understood that the lead support 116 may not bridge to the outer leads 114.

Figure 2:
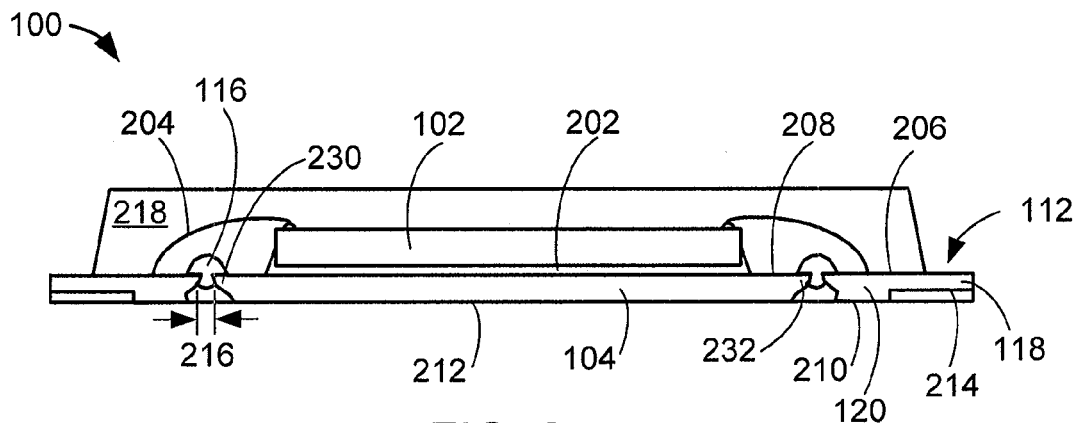
FIG. 2 is a cross-sectional view of the integrated circuit package system along a line 2-2 of FIG. 1.

Referring now to FIG. 2, therein is shown a cross-sectional view of the integrated circuit package system 100 along a line 2-2 of FIG. 1. The cross-sectional view depicts the paddle 104 between the inner leads 112. The integrated circuit die 102 mounts over the paddle 104 with an adhesive 202, such as a die-attach adhesive. Interconnects 204, such as bond wires, connect the integrated circuit die 102 and the inner leads 112.

For illustrative purposes, the integrated circuit package system 100 is shown with the integrated circuit die 102, although it is understood that the integrated circuit die 102 may represent another integrated circuit package system (not shown). Also for illustrative purposes, the integrated circuit package system 100 is shown with the integrated circuit die 102, although it is understood that the integrated circuit die 102 may represent a stack of integrated circuit dice (not shown).

The cross-sectional view depicts that an inner lead topside 206 of the inner leads 112 and a paddle topside 208 of the paddle 104 are coplanar. The cross-sectional view also depicts that an inner body bottom side 210 of the inner lead body 120 and a paddle bottom side 212 of the paddle 104 are coplanar. The inner lead tip 118 had an inner tip bottom side 214, wherein the inner tip bottom side 214 is above the inner body bottom side 210. The inner leads 112 can have an inner body overhang 230. The inner body overhang 230 can be along the inner lead topside 208 and can extend beyond the inner lead bottom side 212 towards the paddle 104. The paddle 104 can have a paddle overhang 232. The paddle overhang 232 can be along the paddle topside 208 and can extend beyond the paddle bottom side 212 towards the inner lead body 120.

The lead support 116 bridges the paddle 104 and the inner leads 112, wherein the lead support 116 covers spaces 216 between the paddle 104 and the inner leads 112. The lead support 116 covers a peripheral portion of the paddle topside 208 and a center most portion of the inner lead topside 206 without extending to the paddle bottom side 212 or the inner body bottom side 210. The lead support 116 can be over only the inner body overhang 230 and the only over the paddle overhang 232.

An encapsulation 218, such an epoxy mold compound, covers the lead support 116, the integrated circuit die 102, and the interconnects 204. The encapsulation 218 also partially covers the inner leads 112 and the paddle 104 exposing the paddle bottom side 212 and the inner body bottom side 210. The lead support 116 reinforces the planar rigidity of the inner leads 112 with the paddle 104. The lead support 116 provides structural reinforcement to maintain the coplanarity between the inner body bottom side 210 and the paddle bottom side 212 thereby mitigating or eliminating mold flashing of the inner leads 112.

Figure 3:
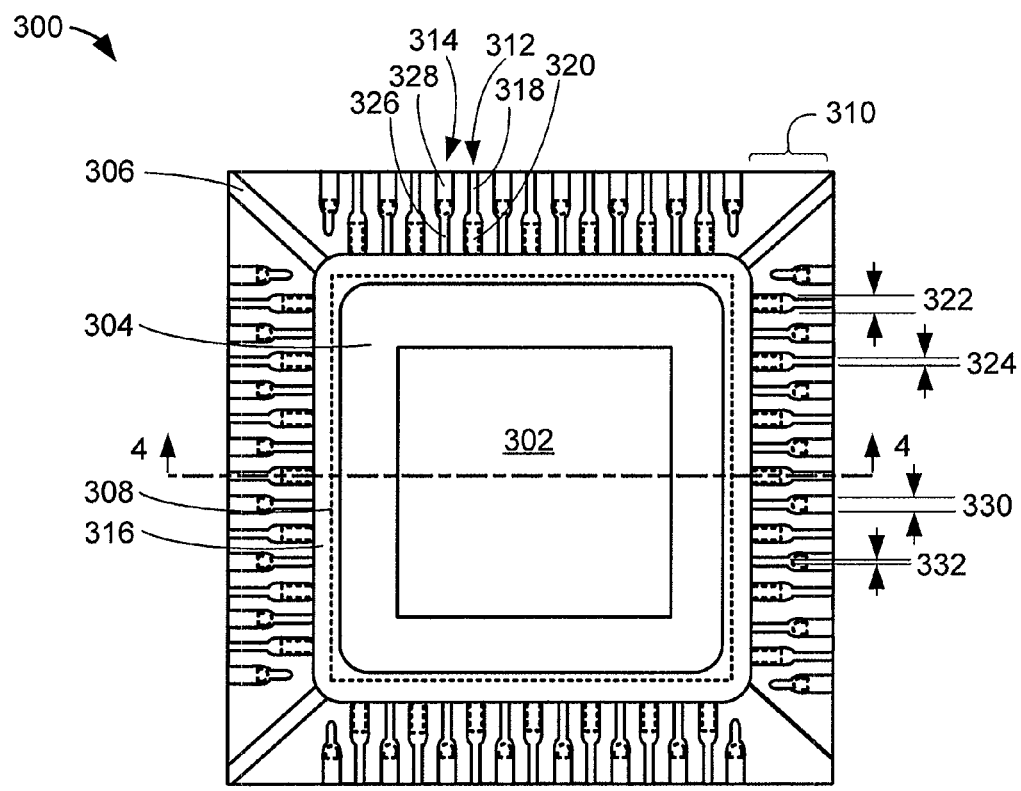
FIG. 3 is a plan view of an integrated circuit package system in an alternative second embodiment of the present invention.

Referring now to FIG. 3, therein is shown a plan view of an integrated circuit package system 300 in an alternative second embodiment of the present invention. The plan view depicts a top view of the integrated circuit package system 300 that is uncovered and with an integrated circuit die 302 that is unconnected. The plan view depicts the integrated circuit die 302 over a paddle 304, such as a die-attach paddle. The integrated circuit die 302 has horizontal dimensions less than that of the paddle 304.

The paddle 304 has tie bars 306 extending from corners of the paddle 304. Sides 308 of the paddle 304 are adjacent to dual rows of leads 310. The sides 308 are depicted by dotted lines. The dual rows of the leads 310 include a first row of inner leads 312 and a second row of outer leads 314. For illustrative purposes, the integrated circuit package system 300 is shown with the dual rows of the leads 310, although it is understood that the integrated circuit package system 300 may have the leads 310 that may be different than dual rows, such as a single row or more than dual rows.

A lead support 316, such as a tape adhesive, preferably bridges the paddle 304 with the inner leads 312 and the outer leads 314 as well as a portion of the tie bars 306 closest to the paddle 304. The lead support 316 is preferably formed in a ring configuration over the sides 308 of the paddle 304 and not contacting the integrated circuit die 302. The lead support 316 provides structural reinforcement to the planar rigidity of the inner leads 312 and the outer leads 314 with the paddle 304.

Each of the inner leads 312 preferably has an inner lead tip 318 and an inner lead body 320. The inner lead tip 318 is towards to the periphery of the integrated circuit package system 300. The inner lead body 320 is towards the center of the integrated circuit package system 300. The plan view depicts the inner lead body 320 having an inner body width 322 extending from an inner tip width 324 of the inner lead tip 318. Typically, the inner lead body 320 provides the contact structure for electrical connection with the integrated circuit die 302. The inner lead tip 318 may also be used for electrical connection with the integrated circuit die 302.

Each of the outer leads 314 preferably has an outer lead tip 326 and an outer lead body 328. The outer lead body 328 is towards to the periphery of the integrated circuit package system 300. The outer lead tip 326 is towards the center of the integrated circuit package system 300. The plan view depicts the outer lead body 328 have an outer body width 330 extending from an outer tip width 332 of the outer lead tip 326. Typically, the outer lead body 328 provides the contact structure for electrical connections with the integrated circuit die 302. The outer lead tip 326 may also be used for electrical connection with the integrated circuit die 302.

As described earlier, the lead support 316 preferably bridges the paddle 304 with the inner leads 312 and the outer leads 314. The lead support 316 preferably bridges the paddle 304 and the inner lead body 320 for reinforcing the inner leads 312 with the lead support 316. The lead support 316 does not cover the inner lead tip 318 or the inner lead body 320 adjacent to the inner lead tip 318. The lead support 316 is shown bridging the paddle 304 and the outer lead tip 326. The lead support 316 does not cover the outer lead body 328 or the outer lead tip 326 adjacent to the outer lead body 328.

For illustrative purposes, the integrated circuit die 302 is shown within the sides 308 of the paddle 304, although it is understood that the integrated circuit die 302 may extend beyond the sides 308 of the paddle 304 and overhanging the paddle 304. Also for illustrative purposes, the integrated circuit die 302 is shown with an area outlined by the ring configuration of the lead support 316, although it is understood that the integrated circuit die 302 may not be within the ring configuration of the lead support 316. For example, the integrated circuit die 302 may extend over the paddle 304 and the lead support 316 and may or may not contact the lead support 316. Further for illustrative purposes, the lead support 316 is shown over the outer leads 314, although it is understood that the lead support 316 may not bridge to the outer leads 314.

Figure 4:
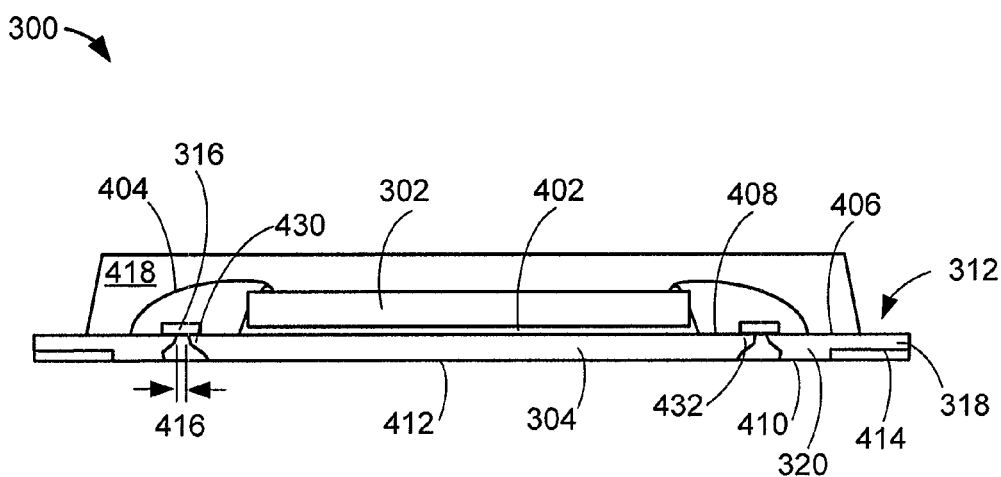
FIG. 4 is a cross-sectional view of the integrated circuit package system along a line 4-4 of FIG. 3.

Referring now to FIG. 4, therein is shown a cross-sectional view of the integrated circuit package system 300 along a line 4-4 of FIG. 3. The cross-sectional view depicts the paddle 304 between the inner leads 312. The integrated circuit die 302 mounts over the paddle 304 with an adhesive 402, such as a die-attach adhesive. Interconnects 404, such as bond wires, connect the integrated circuit die 302 and the inner leads 312.

For illustrative purposes, the integrated circuit package system 300 is shown with the integrated circuit die 302, although it is understood that the integrated circuit die 302 may represent another integrated circuit package system (not shown). Also for illustrative purposes, the integrated circuit package system 300 is shown with the integrated circuit die 302, although it is understood that the integrated circuit die 302 may represent a stack of integrated circuit dice (not shown).

The cross-sectional view depicts that an inner lead topside 406 of the inner leads 312 and a paddle topside 408 of the paddle 304 are coplanar. The cross-sectional view also depicts that an inner body bottom side 410 of the inner lead body 320 and a paddle bottom side 412 of the paddle 304 are coplanar. The inner lead tip 318 had an inner tip bottom side 414, wherein the inner tip bottom side 414 is above the inner body bottom side 410. The inner leads 312 can have an inner body overhang 430. The inner body overhang 430 can be along the inner lead topside 408 and can extend beyond the inner lead bottom side 412 towards the paddle 304. The paddle 304 can have a paddle overhang 432. The paddle overhang 432 can be along the paddle topside 408 and can extend beyond the paddle bottom side 412 towards the inner lead body 320.

The lead support 316 bridges the paddle 304 and the inner leads 312, wherein the lead support 316 covers spaces 416 between the paddle 304 and the inner leads 312. The lead support 316 covers a peripheral portion of the paddle topside 408 and a center most portion of the inner lead topside 406 without extending to the paddle bottom side 412 or the inner body bottom side 410. The lead support 316 can be over only the inner body overhang 430 and the only over the paddle overhang 432.

An encapsulation 418, such an epoxy mold compound, covers the lead support 316, the integrated circuit die 302, and the interconnects 404. The encapsulation 418 also partially covers the inner leads 312 and the paddle 304 exposing the paddle bottom side 412 and the inner body bottom side 410. The lead support 316 reinforces the planar rigidity of the inner leads 312 with the paddle 304. The lead support 316 provides structural reinforcement to maintain the coplanarity between the inner body bottom side 410 and the paddle bottom side 412 thereby mitigating or eliminating mold flashing of the inner leads 312.

Figure 5:
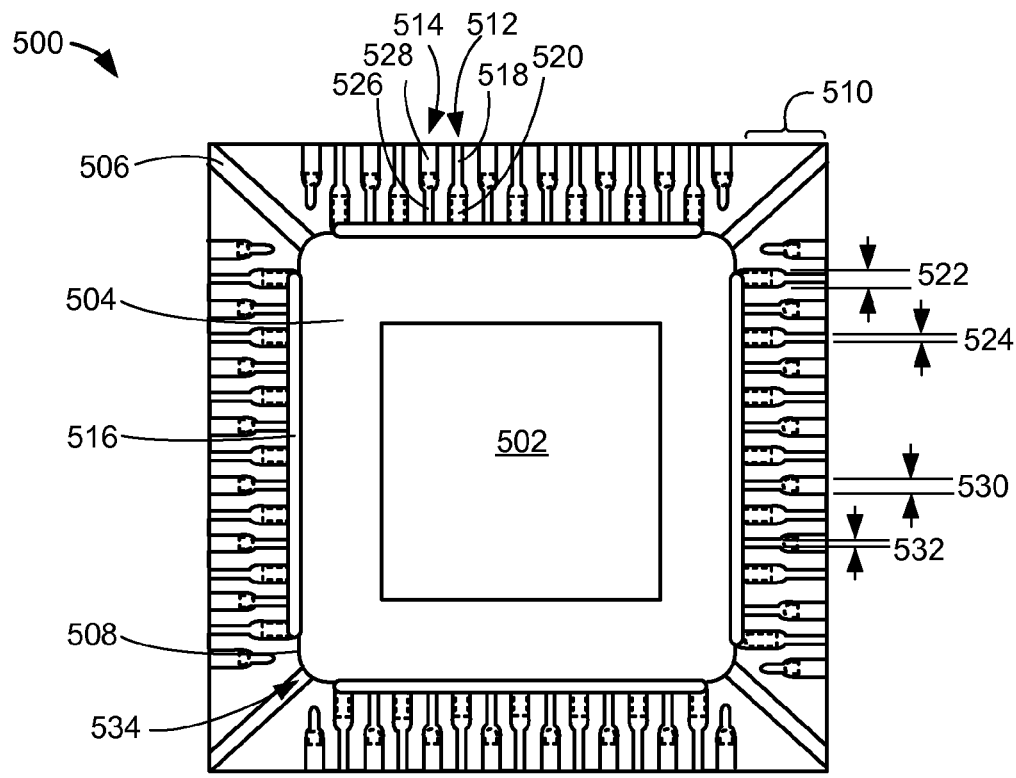
FIG. 5 is a plan view of an integrated circuit package system in an alternative third embodiment of the present invention.

Referring now to FIG. 5, therein is shown a plan view of an integrated circuit package system 500 in an alternative third embodiment of the present invention. The plan view depicts a top view of the integrated circuit package system 500 that is uncovered and with an integrated circuit die 502 that is unconnected. The plan view depicts the integrated circuit package system 500 with structurally similarities with the integrated circuit package system 100 of FIG. 1 or with the integrated circuit package system 300 of FIG. 3.

The plan view depicts the integrated circuit die 502 over a paddle 504, such as a die-attach paddle. The paddle 504 has tie bars 506 extending from corners of the paddle 504. Sides 508 of the paddle 504 are adjacent to dual rows of leads 510. The dual rows of leads 510 include a first row of inner leads 512 and a second row of outer leads 514.

A lead support 516, such as a dispensed epoxy adhesive, a tape adhesive, or glob top epoxy, preferably bridges the sides 508 of the paddle 504 with the inner leads 512 and the outer leads 514. The lead support 516 does cover the corners of the paddle 504 with the tie bars 506 providing openings 534 for mold flow. The openings 534 are optional. The lead support 516 is preferably formed in a segment configuration with each segment over each of the sides 508 of the paddle 504 and not contacting the integrated circuit die 502. The lead support 516 provides structural reinforcement to the planar rigidity of the inner leads 512 and the outer leads 514 with the paddle 504.

Each of the inner leads 512 preferably has an inner lead tip 518 and an inner lead body 520. The plan view depicts the inner lead body 520 having an inner body width 522 extending from an inner tip width 524 of the inner lead tip 518.

Each of the outer leads 514 preferably has an outer lead tip 526 and an outer lead body 528. The plan view depicts the outer lead body 528 have an outer body width 530 extending from an outer tip width 532 of the outer lead tip 526.

As described earlier, the lead support 516 preferably bridges the paddle 504 with the inner leads 512 and the outer leads 514. The lead support 516 preferably bridges the paddle 504 and the inner lead body 520 for reinforcing the inner leads 512 with the lead support 516 and for mitigating or eliminating mold flashing of the inner leads 512. The lead support 516 does not cover the inner lead tip 518 or the inner lead body 520 adjacent to the inner lead tip 518. The lead support 516 is shown bridging the paddle 504 and the outer lead tip 526. The lead support 516 does not cover the outer lead body 528 or the outer lead tip 526 adjacent to the outer lead body 528.

Figure 6:
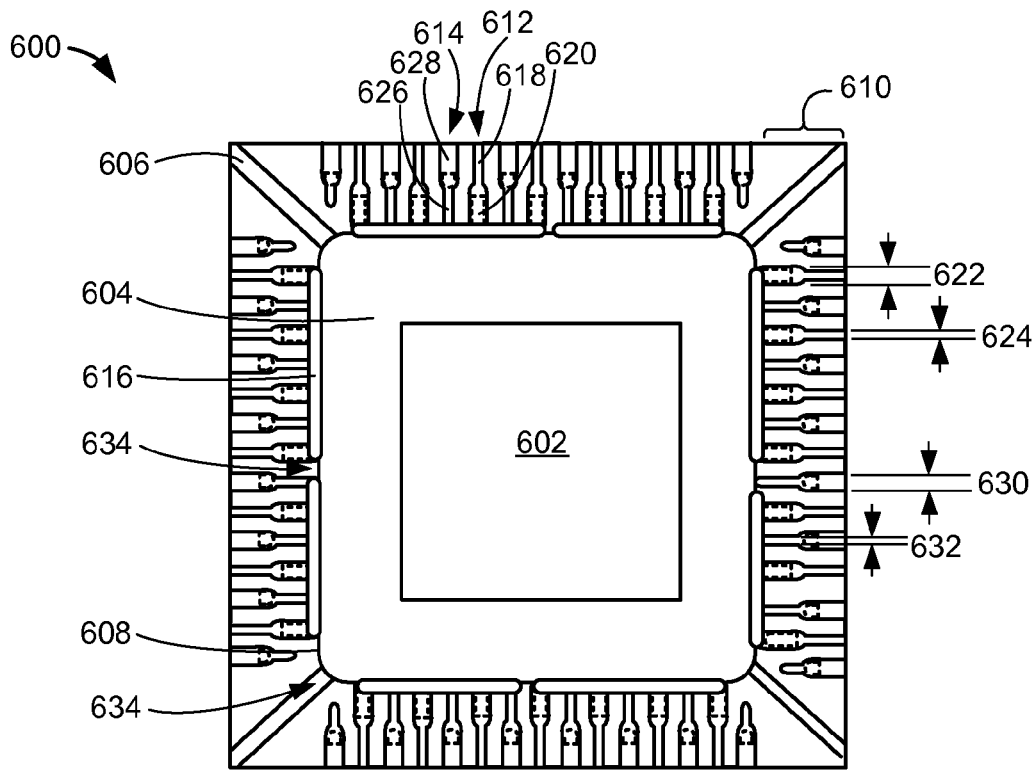
FIG. 6 is a plan view of an integrated circuit package system in an alternative fourth embodiment of the present invention.

Referring now to FIG. 6, therein is shown a plan view of an integrated circuit package system 600 in an alternative fourth embodiment of the present invention. The plan view depicts a top view of the integrated circuit package system 600 that is uncovered and with an integrated circuit die 602 that is unconnected. The plan view depicts the integrated circuit package system 600 with structurally similarities with the integrated circuit package system 100 of FIG. 1 or with the integrated circuit package system 300 of FIG. 3.

The plan view depicts the integrated circuit die 602 over a paddle 604, such as a die-attach paddle. The paddle 604 has tie bars 606 extending from corners of the paddle 604. Sides 608 of the paddle 604 are adjacent to dual rows of leads 610. The dual rows of the leads 610 include a first row of inner leads 612 and a second row of outer leads 614.

A lead support 616, such as a dispensed epoxy adhesive, a tape adhesive, or glob top epoxy, preferably bridges the sides 608 of the paddle 604 with the inner leads 612 and a portion of the outer leads 614. The lead support 616 is preferably formed in a multi-segment configuration with each segment over a portion of each of the sides 608 of the paddle 604 and not contacting the integrated circuit die 602. The lead support 616 does cover the corners of the paddle 604 with the tie bars 606 and a portion of the sides 608 and the leads 610 providing openings 634 for mold flow. The openings 634 are optional. The lead support 616 provides structural reinforcement to the planar rigidity of the inner leads 612 and the outer leads 614 with the paddle 604.

Each of the inner leads 612 preferably has an inner lead tip 618 and an inner lead body 620. The plan view depicts the inner lead body 620 having an inner body width 622 extending from an inner tip width 624 of the inner lead tip 618.

Each of the outer leads 614 preferably has an outer lead tip 626 and an outer lead body 628. The plan view depicts the outer lead body 628 have an outer body width 630 extending from an outer tip width 632 of the outer lead tip 626.

As described earlier, the lead support 616 preferably bridges the paddle 604 with the inner leads 612 and a portion of the outer leads 614. The lead support 616 preferably bridges the paddle 604 and the inner lead body 620 for reinforcing the inner leads 612 with the lead support 616 and for mitigating or eliminating mold flashing of the inner leads 612. The lead support 616 does not cover the inner lead tip 618 or the inner lead body 620 adjacent to the inner lead tip 618. The lead support 616 is shown bridging the paddle 604 and the outer lead tip 626. For the outer leads 614 bridged with the lead support 616, the lead support 616 does not cover the outer lead body 628 or the outer lead tip 626 adjacent to the outer lead body 628.

Figure 7:
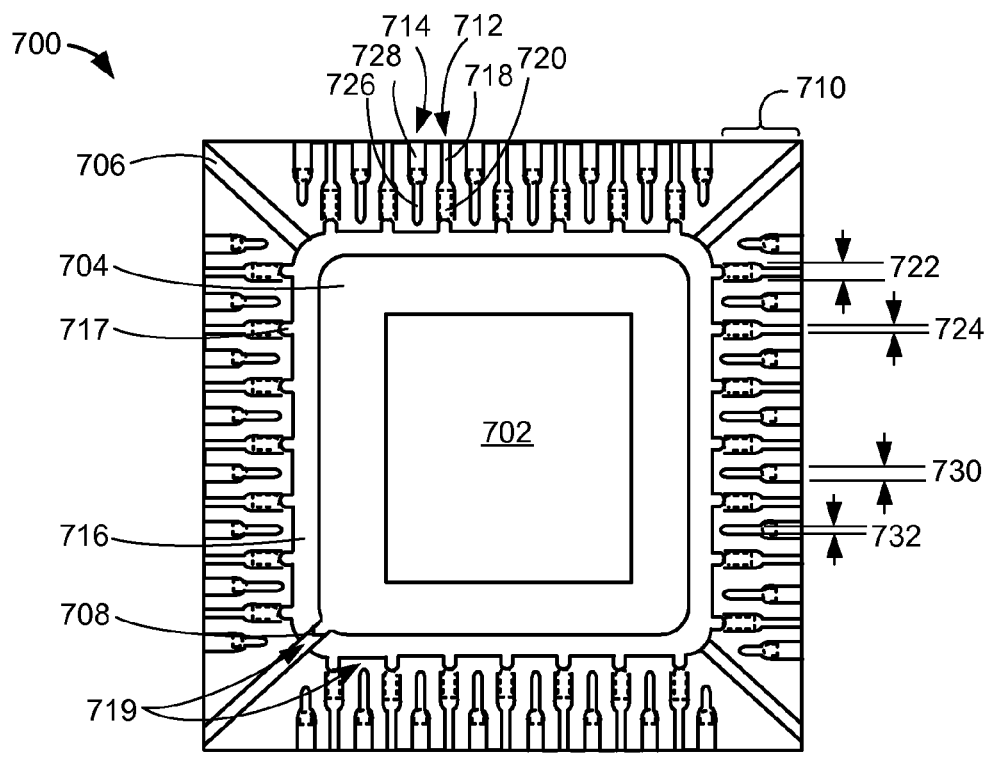
FIG. 7 is a plan view of an integrated circuit package system in an alternative fifth embodiment of the present invention.

Referring now to FIG. 7, therein is shown a plan view of an integrated circuit package system 700 in an alternative fifth embodiment of the present invention. The plan view depicts a top view of the integrated circuit package system 700 that is uncovered and with an integrated circuit die 702 that is unconnected. The plan view depicts the integrated circuit package system 700 with structurally similarities with the integrated circuit package system 100 of FIG. 1 or with the integrated circuit package system 300 of FIG. 3.

The plan view depicts the integrated circuit die 702 over a paddle 704, such as a die-attach paddle. The paddle 704 has tie bars 706 extending from corners of the paddle 704. Sides 708 of the paddle 704 are adjacent to dual rows of leads 710. The dual rows of leads 710 include a first row of inner leads 712 and a second row of outer leads 714.

A lead support 716, such as a dispensed epoxy adhesive, a tape adhesive, or glob top epoxy, preferably bridges the sides 708 of the paddle 704 with the inner leads 712. The lead support 716 is preferably formed in a ring configuration having protrusions 717 from the lead support 716. The lead support 716 is over the sides 708 of the paddle 704 and not contacting the integrated circuit die 702. The lead support 716 does not bridge the paddle 704 and the outer leads 714 providing openings 719 for mold flow. The openings 719 are optional. The lead support 716 provides structural reinforcement to the planar rigidity of the inner leads 712 and the outer leads 714 with the paddle 704.

Each of the inner leads 712 preferably has an inner lead tip 718 and an inner lead body 720. The plan view depicts the inner lead body 720 having an inner body width 722 extending from an inner tip width 724 of the inner lead tip 718.

Each of the outer leads 714 preferably has an outer lead tip 726 and an outer lead body 728. The plan view depicts the outer lead body 728 have an outer body width 730 extending from an outer tip width 732 of the outer lead tip 726.

As described earlier, the lead support 716 preferably bridges the paddle 704 with the inner leads 712. The lead support 716 preferably bridges the paddle 704 and the inner lead body 720 with one of the protrusions 717 bridging the paddle 704 to one of the inner leads 712. The lead support 716 with the protrusions 717 reinforces the inner leads 712 with the paddle 704 mitigating or eliminating mold flashing of the inner leads 712. The lead support 716 does not cover the inner lead tip 718 or the inner lead body 720 adjacent to the inner lead tip 718.

Figure 8:
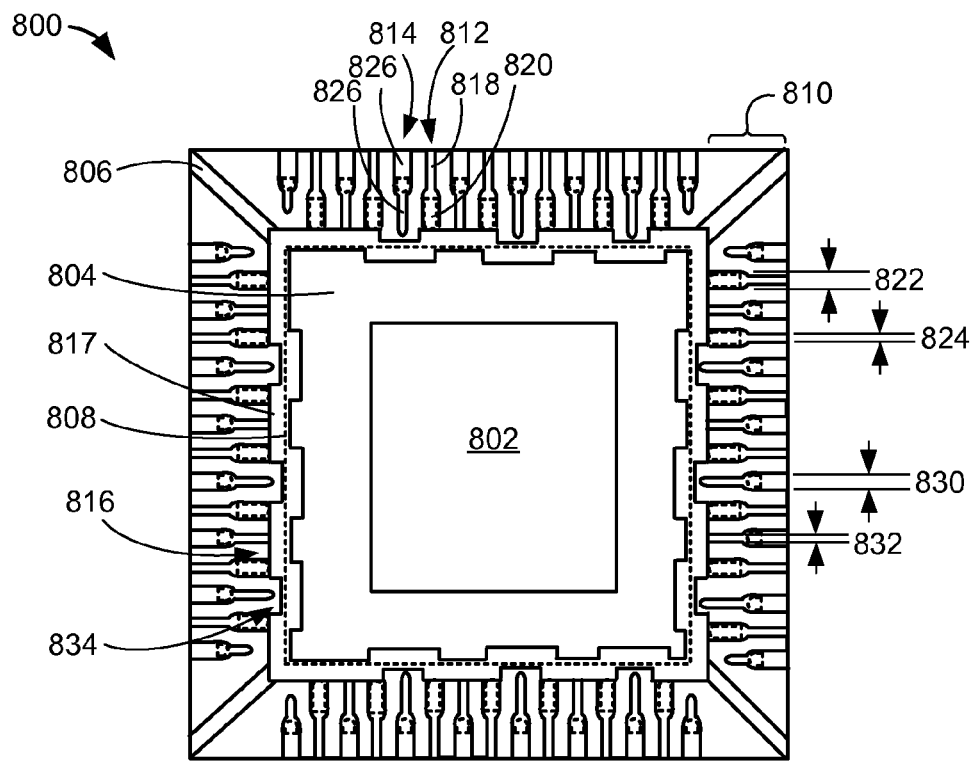
FIG. 8 is a plan view of an integrated circuit package system in an alternative sixth embodiment of the present invention.

Referring now to FIG. 8, therein is shown a plan view of an integrated circuit package system 800 in an alternative sixth embodiment of the present invention. The plan view depicts a top view of the integrated circuit package system 800 that is uncovered and with an integrated circuit die 802 that is unconnected. The plan view depicts the integrated circuit package system 800 with structurally similarities with the integrated circuit package system 100 of FIG. 1 or with the integrated circuit package system 300 of FIG. 3.

The plan view depicts the integrated circuit die 802 over a paddle 804, such as a die-attach paddle. The paddle 804 has tie bars 806 extending from corners of the paddle 804. Sides 808 of the paddle 804 are adjacent to dual rows of leads 810. The sides 808 are depicted by dotted lines. The dual rows of the leads 810 include a first row of inner leads 812 and a second row of outer leads 814.

A lead support 816, such as a dispensed epoxy adhesive, a tape adhesive, or glob top epoxy, preferably bridges the sides 808 of the paddle 804 with the inner leads 812. The lead support 816 is preferably formed in a ring configuration having protrusions 817 from the lead support 816. The lead support 816 is over the sides 808 of the paddle 804 and not contacting the integrated circuit die 802.

Each of the inner leads 812 preferably has an inner lead tip 818 and an inner lead body 820. The plan view depicts the inner lead body 820 having an inner body width 822 extending from an inner tip width 824 of the inner lead tip 818.

Each of the outer leads 814 preferably has an outer lead tip 826 and an outer lead body 828. The plan view depicts the outer lead body 828 have an outer body width 830 extending from an outer tip width 832 of the outer lead tip 826.

As described earlier, the lead support 816 preferably bridges the paddle 804 with the inner leads 812. The lead support 816 preferably bridges the paddle 804 and the inner lead body 820 with one of the protrusions 817 bridging the paddle 804 to a number of the inner leads 812 and to the outer leads 814 between the inner leads 812 that are bridged. The lead support 816 with the protrusions 817 reinforces the inner leads 812 with the paddle 804 mitigating or eliminating mold flashing of the inner leads 812 by providing structural reinforcement to the planar rigidity of the inner leads 812 with the paddle 804. The lead support 816 does not cover the inner lead tip 818 or the inner lead body 820 adjacent to the inner lead tip 818 The lead support 816 having the protrusions 817 does not bridge the paddle 804 and all the outer leads 814 providing openings 834 for mold flow. The openings 834 are optional.

Figure 9:
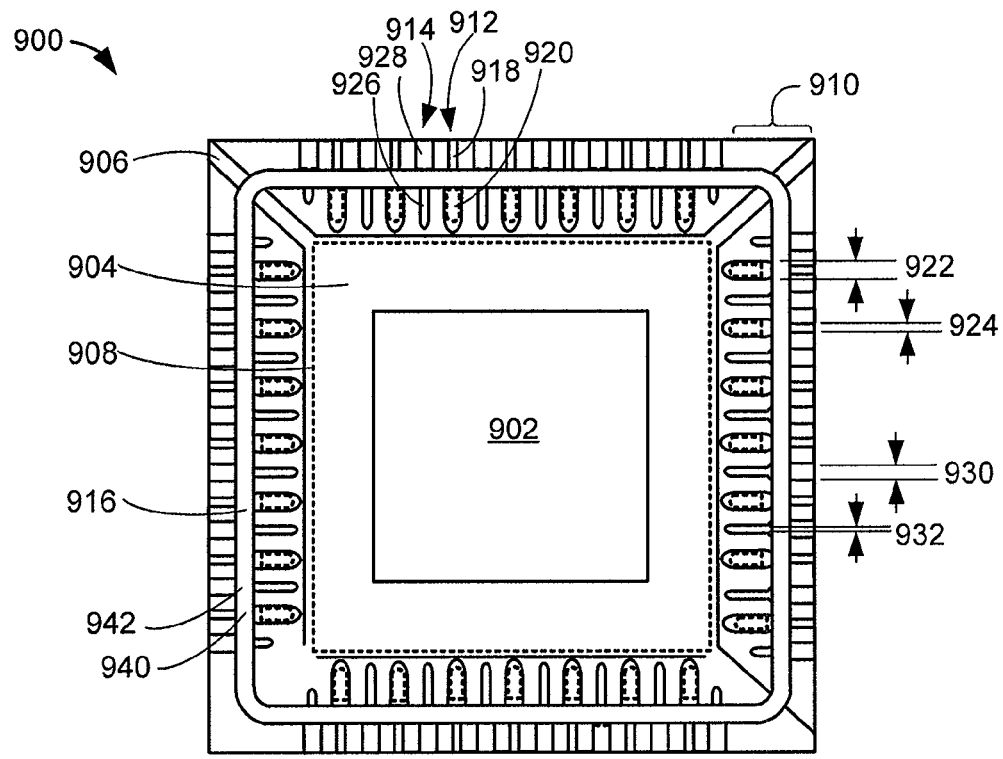
FIG. 9 is a plan view of an integrated circuit package system in an alternative seventh embodiment of the present invention.

Referring now to FIG. 9, therein is shown a plan view of an integrated circuit package system 900 in an alternative seventh embodiment of the present invention. The plan view depicts a top view of the integrated circuit package system 900 that is uncovered and with an integrated circuit die 902 that is unconnected. The plan view depicts the integrated circuit package system 900 with structurally similarities with the integrated circuit package system 100 of FIG. 1 or with the integrated circuit package system 300 of FIG. 3.

The plan view depicts the integrated circuit die 902 over a paddle 904, such as a die-attach paddle. The paddle 904 has tie bars 906 extending from corners of the paddle 904. Sides 908 of the paddle 904 are adjacent to dual rows of leads 910. The dual rows of the leads 910 include a first row of inner leads 912 and a second row of outer leads 914.

Each of the inner leads 912 preferably has an inner lead tip 918 and an inner lead body 920. The plan view depicts the inner lead body 920 having an inner body width 922 extending from an inner tip width 924 of the inner lead tip 918.

Each of the outer leads 914 preferably has an outer lead tip 926 and an outer lead body 928. The plan view depicts the outer lead body 928 have an outer body width 930 extending from an outer tip width 932 of the outer lead tip 926.

A lead support 916, such as a dispensed epoxy adhesive, a tape adhesive, or glob top epoxy, preferably bridges the inner leads 912, the outer leads 914, and the tie bars 906. The lead support 916 is preferably formed in a ring configuration not contacting the paddle 904 and the integrated circuit die 902. The lead support 916 provides structural reinforcement to the planar rigidity of the inner leads 912, the outer leads 914, and the tie bars 906 with each other for mitigating or eliminating mold flashing of the inner leads 912.

The lead support 916 preferably only bridges the inner leads 912 with the outer leads 914 at an inner lead transition 940 between the inner lead tip 918 with the inner lead body 920 and an outer lead transition 942 between the outer lead tip 926 with the outer lead body 928, respectively. The lead support 916 exposes the inner lead body 920 and the outer lead body 928 for connecting the integrated circuit die 902 and interconnects 934, such as bond wires.

Figure 10:
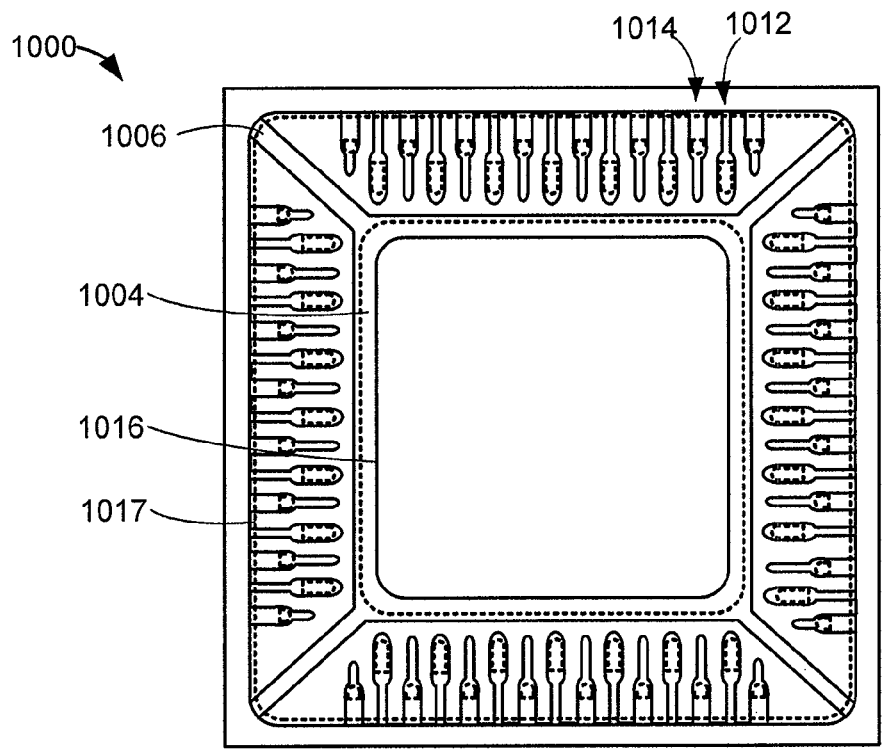
FIG. 10 is a plan view of a lead frame for forming the integrated circuit package system of FIG. 1 in an embodiment of the present invention.

Referring now to FIG. 10, therein is shown a plan view of a lead frame 1000 for forming the integrated circuit package system 100 of FIG. 1 in an embodiment of the present invention. The lead frame 1000 may be including in forming the other alternative embodiments of the present invention.

The lead frame 1000 includes a dam bar 1001 with inner leads 1012, outer leads 1014, and tie bars 1006 extending therefrom. The tie bars 1006 connect to corners of a paddle 1004. A ground ring 1015, such as silver plated ring, is shown on the paddle 1004.

A lead support 116 of FIG. 1 may be formed within a region 1017 outlined by the dotted line while providing predetermined bonding area for electrical connections for the integrated circuit die 102 of FIG. 1. The lead support 116 may be formed by a number of different processes, such as dispensing or taping.

The lead support 116 may preferably be shaped in any manner for mechanically supporting or providing reinforcement to the inner leads 1012. The lead support 116 may additionally provide mechanical support or reinforcement to the outer leads 1014.

Figure 11:
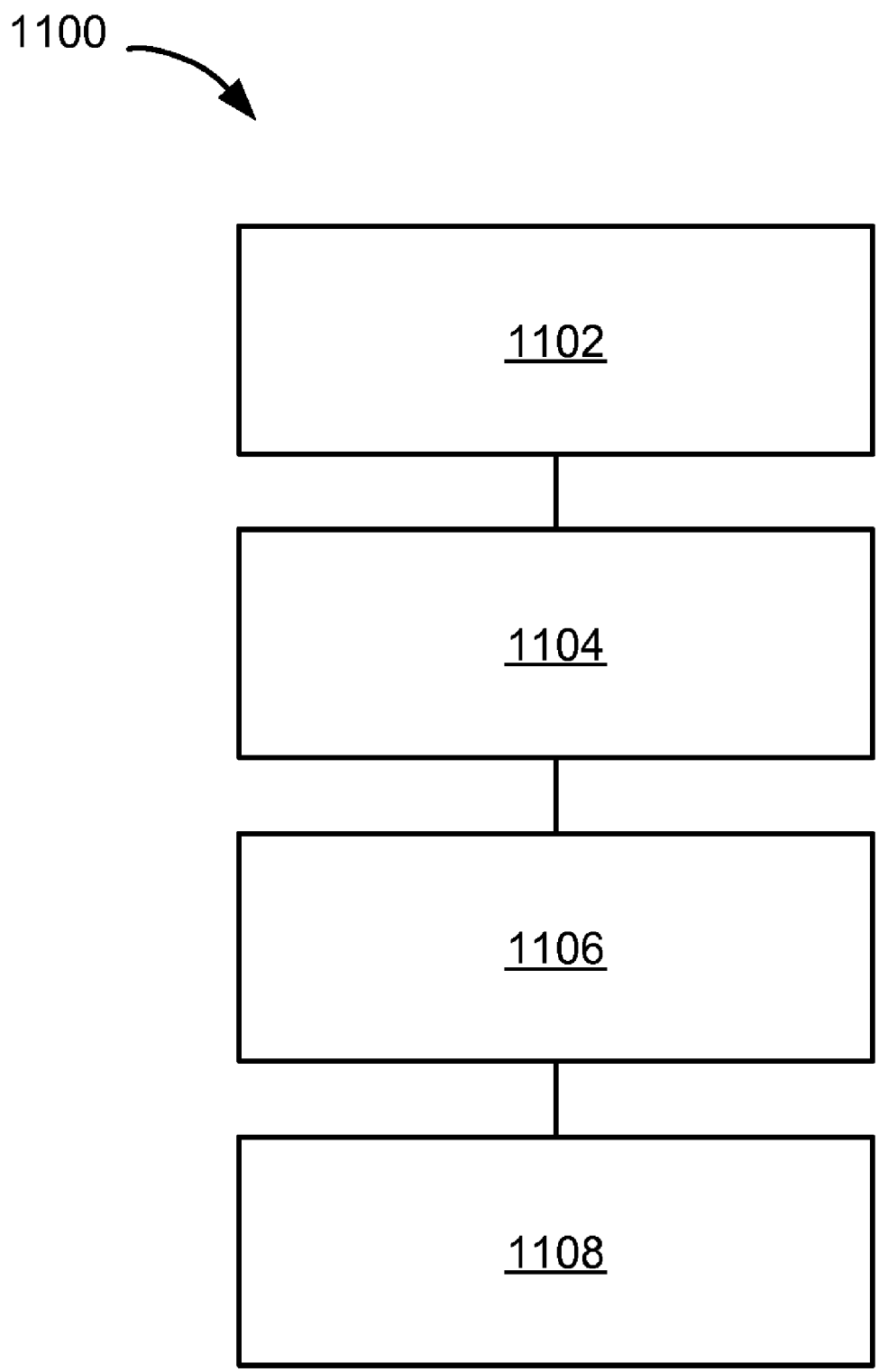
FIG. 11 is a flow chart of an integrated circuit package system for manufacture of the integrated circuit package system in an embodiment of the present invention.

Referring now to FIG. 11, therein is shown a flow chart of an integrated circuit package system 1100 for manufacture of the integrated circuit package system 100 in an embodiment of the present invention. The system 1100 includes forming a paddle having an integrated circuit die thereover, an outer lead, and an inner lead between the paddle and the outer lead in a block 1102; placing a lead support over the inner lead without traversing to an inner body bottom side of the inner lead in a block 1104; connecting the integrated circuit die and the inner lead in a block 1106; and encapsulating the inner lead having the lead support thereover and the inner lead exposed in a block 1108.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   forming a paddle, having an integrated circuit die thereover and a paddle overhang, an outer lead, and an inner lead between the paddle and the outer lead, the inner lead having an inner body overhang;
   placing a lead support, over only the paddle overhang and over only the inner body overhang or only over an inner lead transition, to encircle the paddle without traversing to an inner body bottom side of the inner lead;
   connecting the integrated circuit die and the inner lead
   encapsulating the inner lead having the lead support protruding, the paddle, the outer lead, and the integrated circuit die including exposing the inner body bottom side from the encapsulation; and
   wherein placing the lead support over only the paddle overhang and over only the inner body overhang includes bridging the inner lead and the paddle with the lead support.

2. The method as claimed in claim 1 wherein placing the lead support includes bridging the inner lead and the outer lead without traversing to an outer body bottom side of the outer lead.

3. The method as claimed in claim 1 wherein placing the lead support includes placing a protrusion of the lead support over the inner lead.

4. The method as claimed in claim 1 wherein placing the lead support includes placing a protrusion of the lead support over the inner lead and the outer lead without surrounding the outer lead.

5. A method of manufacturing an integrated circuit package system comprising:
   forming a paddle, having an integrated circuit die thereover and a paddle overhang, an outer lead, and an inner lead between the paddle and the outer lead with a paddle bottom side coplanar with an inner body bottom side of the inner lead, the inner lead having an inner lead body overhang;
   placing a lead support, over only the paddle overhang and over only the inner body overhang or only over an inner lead transition, to encircle the paddle without traversing to the inner body bottom side of the inner lead;
   connecting the integrated circuit die with the inner lead and the outer lead; and
   encapsulating the inner lead having the lead support protruding, the paddle, the outer lead, and the integrated circuit die including exposing the inner body bottom side and an outer body bottom side, of the outer lead, from the encapsulation; and
   wherein placing the lead support over only the paddle overhang and over only the inner body overhang includes bridging the inner lead and the paddle with the lead support.

6. The method as claimed in claim 5 wherein placing the lead support includes bridging the inner lead, the paddle, and the outer lead with the lead support with the paddle bottom side and the outer body bottom side exposed.

7. The method as claimed in claim 5 wherein placing the lead support includes placing a protrusion of the lead support over the inner lead and the lead support over the paddle.

8. The method as claimed in claim 5 wherein placing the lead support includes dispensing the lead support comprised of an epoxy.

9. The method as claimed in claim 5 wherein placing the lead support includes taping the lead support comprised of an adhesive.

10. An integrated circuit package system comprising:
    a paddle having a paddle overhang;
    an integrated circuit die over the paddle;
    an outer lead adjacent the paddle;

an inner lead having an inner body overhang and an inner body bottom side between the paddle and the outer lead;

a lead support encircling the paddle, and over only the paddle overhang and over only the inner body overhang or only over an inner lead transition, without traversing to the inner body bottom side;

an interconnect between the integrated circuit die and the inner lead; and an encapsulation on the inner lead having the lead support thereon, the paddle, the outer lead, and the integrated circuit die includes the inner body bottom side exposed from the encapsulation; and wherein the lead support, over only the paddle overhang and over only the inner body overhang, bridges the inner lead and the paddle.

11. The system as claimed in claim 10 wherein the lead support includes the lead support between the inner lead and the outer lead without traversing to an outer body bottom side of the outer lead.

12. The system as claimed in claim 10 wherein the lead support includes a protrusion of the lead support over the inner lead.

13. The system as claimed in claim 10 wherein the lead support includes a protrusion of the lead support over the inner lead and the outer lead without traversing to an outer body bottom side of the outer lead.

14. The system as claimed in claim 10 wherein:

the paddle is a die-attach paddle with a paddle bottom side;

the outer lead includes an outer lead tip and an outer lead body;

the inner lead, having an inner lead tip and an inner lead body, has the inner body bottom side coplanar with the paddle bottom side;

the lead support is over an inner lead topside of the inner lead;

the integrated circuit die is mounted over the paddle with an adhesive;

the interconnect is a bond wire; and the encapsulation is over the outer lead with an outer body bottom side of the outer lead exposed.

15. The system as claimed in claim 14 wherein the lead support includes the lead support between the inner lead, the paddle, and the outer lead with the paddle bottom side and the outer body bottom side exposed.

16. The system as claimed in claim 14 wherein the lead support includes a protrusion of the lead support over the inner lead and the lead support over the paddle.

17. The system as claimed in claim 14 wherein the lead support includes an epoxy.

18. The system as claimed in claim 14 wherein the lead support includes an adhesive.

* * * * *